United States Patent [19]
Ewen et al.

[11] Patent Number: 5,301,196
[45] Date of Patent: Apr. 5, 1994

[54] HALF-SPEED CLOCK RECOVERY AND DEMULTIPLEXER CIRCUIT

[75] Inventors: John F. Ewen, Yorktown Heights; Albert X. Widmer, Katonah, both of N.Y.

[73] Assignee: International Business Machines Corporation, Armonk, N.Y.

[21] Appl. No.: 853,215

[22] Filed: Mar. 16, 1992

[51] Int. Cl.⁵ .................................... H04J 3/06
[52] U.S. Cl. ........................... 370/105.2; 370/105.3; 375/119
[58] Field of Search .............. 370/77, 105.3, 105.2, 370/112, 84; 375/119, 120; 307/243, 244; 328/153, 154

[56] References Cited

U.S. PATENT DOCUMENTS

| | | | |
|---|---|---|---|
| 3,805,180 | 4/1974 | Widmer | 331/1 A |
| 3,988,696 | 10/1976 | Sharpe | 331/1 A |
| 4,200,845 | 4/1980 | Mendenhall et al. | 331/1 A |
| 4,408,165 | 10/1983 | Braun | 328/134 |
| 4,414,639 | 11/1983 | Talambiras | 364/602 |
| 4,419,760 | 12/1983 | Bjornholt | 375/120 |
| 4,473,805 | 9/1984 | Guhn | 331/1 A |
| 4,486,739 | 12/1984 | Franaszek et al. | 340/347 |
| 4,546,486 | 10/1985 | Evans | 375/119 |
| 4,642,573 | 2/1987 | Noda et al. | 370/105.3 |
| 4,663,769 | 5/1987 | Krinock | 375/110 |
| 4,668,917 | 5/1987 | Levine | 328/133 |
| 4,780,893 | 10/1988 | Henkelman, Jr. | 375/120 |
| 4,823,363 | 4/1989 | Yoshida | 370/105.3 |
| 4,831,284 | 5/1989 | Anderson et al. | 307/450 |
| 4,920,278 | 4/1990 | Nawata | 307/262 |
| 5,022,057 | 6/1991 | Nishi et al. | 375/119 |
| 5,150,364 | 9/1992 | Negus | 370/112 |

OTHER PUBLICATIONS

"GB/S Fiber Optic Link Adapter Chip Set," J. F. Ewen et al., *IEEE GaAs IC Symposium*, Aug. 1988, pp. 11–14.

"A DC-Balanced Partitioned Block 8B/10B Transmission Code", A. X. Widmer et al. *IBM Journal of Research and Development*, vol. 27, No. 5, Sep. 1983, pp. 450–451.

Primary Examiner—Benedict V. Safourek
Assistant Examiner—Ajit Patel
Attorney, Agent, or Firm—Sterne, Kessler, Goldstein & Fox

[57] ABSTRACT

A clock recovery circuit and demultiplexer circuit which operate at half the data rate of a received data stream. The half-speed clock recovery circuit generates a 0 and 90-degree clock at half the rate of the incoming data. These clocks are sampled by a pair of edge triggered flip-flops using the transitions of the received data as triggers. The outputs of these flip-flops are exclusive OR-ed to provide a signal indicating whether the generated clock leads or lags the received data. The half-speed 1:2 demultiplexer circuit uses the rising and falling edges of a half-speed 90-degree clock to latch the received data through a pair of flip-flops. The outputs of these flip-flops, each triggered by a different edge of the clock, make up two demultiplexed data streams. The clock recovery and demultiplexer circuits of the present invention can be extended to operate at lower clock rates and configured to provide wider demultiplexing.

11 Claims, 5 Drawing Sheets

HALF-SPEED CLOCK RECOVERY AND DEMULTIPLEXER CIRCUIT

TECHNICAL FIELD

The present invention is concerned with an apparatus and method for recovering a clock signal from a received data signal and for demultiplexing the received data signal. The present invention is especially directed to clock recovery and demultiplexer circuits operating at a rate much lower than the rate of the received data signal.

BACKGROUND ART

In digital systems, digital data is typically handled with an associated clock signal. The clock signal is a square wave whose period is equal to the digital data bit period. The clock provides timing necessary to allow digital circuitry to operate on digital data. Basic clock functions include pacing and synchronizing the operations of a digital system, triggering registers and latches in digital circuits, and advancing counters.

When data are transmitted over a communications link, it is generally inefficient to also transmit the associated clock signal. This inefficiency has led to communications systems which transmit the data alone without the clock. Therefore, it is typical for fiber optic communication links to require that the clock signal at the receiving end of the link be extracted from the incoming data signal. To obtain the necessary clock at the receiving end, these systems employ clock recovery circuits. The clock recovery circuit derives the clock signal from the received digital data.

Conventional clock recovery circuits are often implemented using phase-locked loops. In phase-locked loops, a reference clock is generated at the frequency of the received data using a voltage controlled oscillator (VCO). A phase comparator compares the phase angle between the reference clock and a received data signal. The phase comparator outputs a control voltage which is a function of the phase angle between the generated clock and the received data signal. As the phase angle changes, the control voltage changes. The control voltage is fed back to the VCO to adjust the frequency of the reference clock. In this manner, the reference clock may be synchronized with the received data.

The phase-locked loop is often integrated onto a single chip along with other link adapter functions. These functions are described in a publication by J. F. Ewen et al. titled "Gb/s fiber Optic Link Adapter Chip Set," 1988 IEEE GaAs IC Symposium, pp. 11–14. This publication is hereby incorporated in its entirety into this disclosure.

In addition to clock recovery circuits, communications links often utilize demultiplexers at the receiving end. Demultiplexers segregate the serial data stream transmitted over the communications link into its component segments. These segments are typically defined by bytes or words that make up the serial stream. With a demultiplexer at the receiving end, multiple sets of data destined for different parallel processes, addresses, or components can be sent serially over a single communications link.

Conventional clock recovery circuits and demultiplexers operate at the full data rate of the signal transmitted over the communications link. Because the clock recovery and demultiplexing functions are fairly complex, they are difficult to perform at high data rates. As a result, for a given technology, the bandwidth of the communications link that they serve may be limited by the maximum data rate at which the clock recovery and demultiplexer circuits can operate.

This invention makes it possible to increase the maximum data rate of a communications link for a given technology. The present invention provides a combined clock recovery and front-end demultiplexer circuit that can be operated at half the received data rate or less. This allows the maximum data rate of the communications link of the present invention to be at least twice that of a conventional communications link for a given technology.

DISCLOSURE OF INVENTION

The present invention provides an apparatus and method wherein clock recovery and demultiplexer circuits need operate at only half the data rate of a received data signal. In the present invention, a clock recovery circuit and a demultiplexer circuit are combined in such a way that none of the components of these circuits are required to operate at more than half the received data rate. This allows the maximum data rate of a communications link to be doubled for a given technology.

In a preferred embodiment of the present invention, a 0 and 90-degree clock are created in a ring oscillator. These clocks are sampled through a pair of edge triggered flip-flops using an inverted form of the received data. The outputs of these flip-flops are exclusive OR-ed to form a signal indicating whether the generated clock leads or lags the received data. This signal is fed back to the ring oscillator to adjust the phase of the clock relative to the phase of the received data.

In a preferred embodiment of the present invention, a 1:2 demultiplexer circuit operates using the half frequency 90-degree clock generated by the half-speed clock recovery circuit. This 90-degree half-speed clock and an inverted version of this 90-degree half-speed clock are used to sample the received data through a pair of flip-flops. Since the triggering edge of these clocks occurs at different intervals, each corresponding to different bits of received data, the received data is demultiplexed into two separate output streams at the output of each of the flip-flops.

In another embodiment of the present invention, a quarter speed clock recovery circuit and a quarter speed 1:4 demultiplexer are provided. In this embodiment, four phases of a generated quarter speed clock are used, with each offset by 45-degrees. The quarter speed phase comparator consists of four flip-flops, each sampling one phase of the clock. The outputs of the flip-flops are compared in a parity generator whose output is 1 if an odd number of flip-flop outputs are 1 and whose output is 0 for all other conditions. For the one-to-four demultiplexer circuit, four flip-flops are used to latch the data into four different output streams. The four flip-flops are driven by the falling edges of the 45-degree clock and inverted 45-degree clock, the 135-degree clock, and an inverted 135-degree clock.

Further features and advantages of the present invention, as well as the structure and operation of various embodiments of the present invention, are described in detail below with reference to the accompanying drawings. In the drawings, like reference numbers indicate identical or functionally similar elements. Additionally, the left-most digit of a reference number identifies the drawing in which the reference number first appears.

BRIEF DESCRIPTION OF THE DRAWINGS

The present invention will be described with reference to the accompanying drawings, wherein.

BEST MODE FOR CARRYING OUT THE INVENTION

The present invention comprises an apparatus and method for recovering a clock signal from a received data stream and demultiplexing the received data stream. The present invention operates at a maximum of one-half the clock rate of the incoming data.

Figure 1:
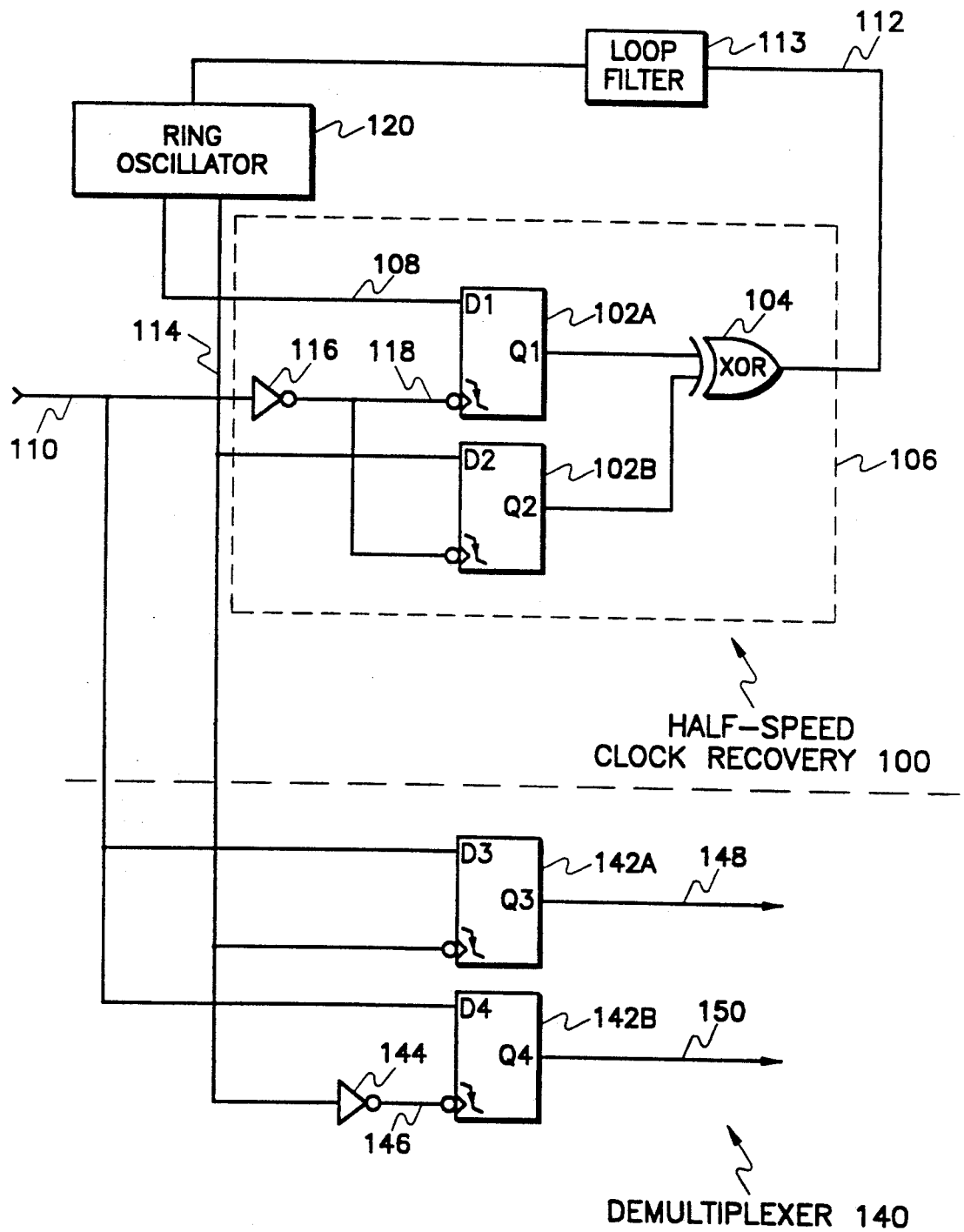
FIG. 1 is a schematic diagram of the half-speed clock recovery circuit and demultiplexer circuit of the preferred embodiment of the invention.
Figure 2A:
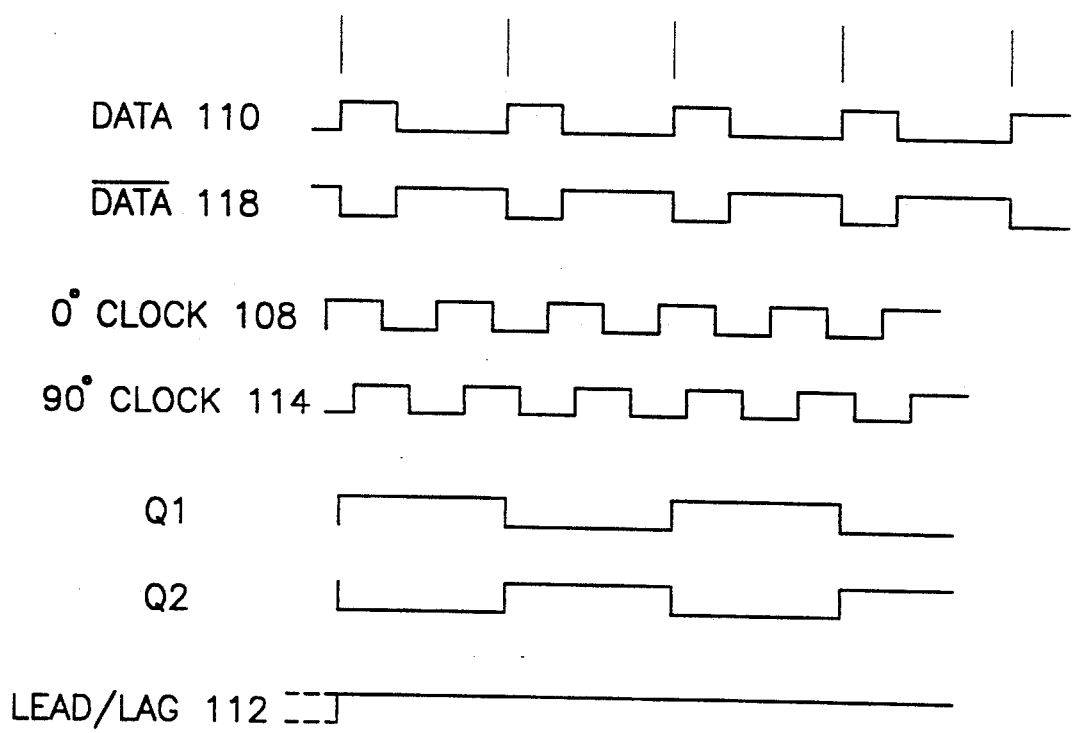
FIG. 2A is a timing diagram illustrating waveforms of a phase comparator 106 of the present invention for the case of the clock leading the data.
Figure 2B:
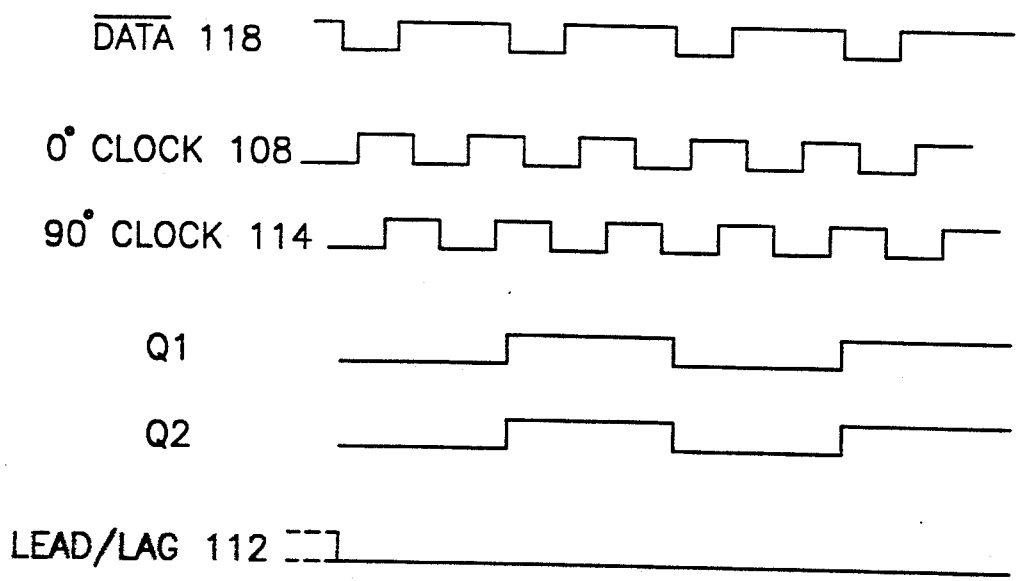
FIG. 2B is a timing diagram illustrating waveforms of a phase comparator 106 of the present invention for the case of the clock lagging behind the data.

FIG. 1 illustrates a schematic diagram of half-speed clock recovery circuit 100 and demultiplexer circuit 140. The half-speed clock recovery circuit 100 and demultiplexer circuit 140 include common, off-the-shelf electrical components. FIGS. 2A and 2B illustrate timing diagrams of the half-speed clock recovery circuit 100. Referring to FIG. 1, the operation of the half-speed clock recovery circuit 100 will now be described.

The half speed clock recovery circuit 100 of the present invention utilizes two flip-flops 102A, 102B and an exclusive-OR gate 104 as a phase comparator 106. Phase comparator 106 compares the phase angle between a generated clock signal 108 (referred to as "clock 108") and a received data signal 110 (referred to as "data 110"). Phase comparator 106 provides feedback in the form of a lead/lag signal 112 which indicates whether clock 108 leads data 110 or lags behind data 110.

A ring oscillator 120 is used to generate clock 108. Ring oscillator 120 also generates a 90-degree clock 114. 90-degree clock 114 is offset from clock 108 by 90-degrees.

An inverter 116 inverts data 110 to create an inverted data signal 118, (referred to as "inverted data 118"). Inverted data 118 is used to trigger flip-flops 102A, 102B. Clock 108 is sampled through edge triggered flip-flop 102A by inverted data 118. When negative transitions of inverted data 118 occur, the logic level of clock 108 at an input D1 of flip-flop 102A is latched to an output Q1 of flip-flop 102A. Output Q1 of flip-flop 102A remains at this state until the next negative transition of inverted data 118. At this next transition, the logic level of clock 108 then present at input D1 of flip-flop 102A is latched to output Q1. This process continues so that at each falling transition of inverted data 118, the logic level of clock 108 present at input D1 is latched to output Q1.

A similar process occurs in flip-flop 102B. However, in flip-flop 102B falling transitions of inverted data 118 are used to sample 90-degree clock 114 levels at input D2 of flip-flop 102B to output Q2 of flip-flop 102B.

Output Q1 is exclusive OR-ed with output Q2 in exclusive-OR gate 104 to form lead/lag signal 112. Lead/lag signal 112 is fed to a loop filter 113, usually a second order low pass filter. Filter 113 is needed to stabilize the loop. The output of filter 113 is fed back to ring oscillator 120 to adjust the rate of clock 108 and 90-degree clock 114. Clock 108 is adjusted to be in phase with receive data 110. Clock 108 and 90-degree clock 114 are at a rate of one half the data 110 rate.

This differs from conventional systems (e.g., U.S. Pat. No. 3,805,180 to Widmer) where the feedback signal is the average of a single flip-flop triggered by rising or falling data transitions, and the clock runs at the encoded bit rate.

Lead/lag signal 112 indicates whether clock 108 is leading or lagging data 110. FIG. 2A illustrates the situation in which clock 108 leads data 110. In other words, FIG. 2A illustrates the situation in which rising transitions of clock 108 precede transitions of data 110. In this situation, falling transitions of inverted data 118 occur at a time when clock 108 is at a different logic level than 90° clock 114. Therefore, output Q1 is always at a different logic state than output Q2. When these outputs are exclusive OR-ed together lead/lag signal 112 is at a logic level high.

FIG. 2B illustrates the situation in which clock 108 lags behind data 110. In other words, FIG. 2B illustrates the situation in which transitions of data 110 precede rising transitions of clock 108. In this situation, falling transitions of inverted data 118 always occur at a time when clock 108 is the same logic level as 90-degree clock 114. Therefore, output Q1 of flip-flop 102A will always be the same state as output Q2 of flip-flop 102B. When these outputs are exclusive OR-ed together, the resulting lead/lag signal 112 will be at a logic-level 0.

As a result, lead/lag signal 112 will always be a logic-level high for the case of clock 108 leading data 110 and a logic-level low for the case of clock 108 lagging behind data 110.

As an alternative, phase comparator 106 can be implemented without inverter 116. In this case, 0-degree clock 108 and 90-degree clock 114 are sampled through flip-flop 102A and flip-flop 102B by the falling edge of data 110.

Referring to FIG. 1, the operation of half-speed demultiplexer 140 will now be described. 90-degree clock 114 is inverted by inverter 144 to create an inverted 90-degree clock 146.

Data 110 at input D3 to flip-flop 142A is latched to output Q3 of flip-flop 142A. This latching occurs at falling transitions of 90-degree clock 114. Note that because 90-degree clock 114 is offset from clock 108, the transitions in 90-degree clock 114 appear in the middle of the bit period of data 110 once the phase-locked loop is in synchronization. This ensures that the logic level of data 110 is settled at the time it is latched to output Q3.

Output Q3 forms a first data signal 148. First data signal 148 is thus re-timed to operate at half the bit rate of data 110 and represents every other bit of data 110.

Similarly, data 110 at an input D4 of flip-flop 142B is latched to output Q4 of flip-flop 142B by inverted 90- degree clock 146. Output Q4 forms a second data signal 150. Second data signal 150 is thus re-timed to half the bit rate of data 110. Second data signal 150 also represents every other bit of data 110, but it represents the bits not represented by data signal 148.

As a result of the operation of demultiplexer 140, two new bit streams are created at half the data rate of the original received data 110. Each of these new data streams 148, 150 represents a demultiplexed portion of the data 110.

It is possible to extend the phase comparator to trigger off both the rising and falling edges of the data by duplicating the phase comparator circuits of FIG. 1 without inverter 116. This second set of latches would trigger on falling transitions of the data. The output of the second exclusive-OR gate would indicate the phase lead or lag condition. Triggering on both the rising and falling edges of the data minimizes the time between corrections in a phase lock loop and can lead to better noise performance depending on the link parameters and data sequences.

Figure 3:
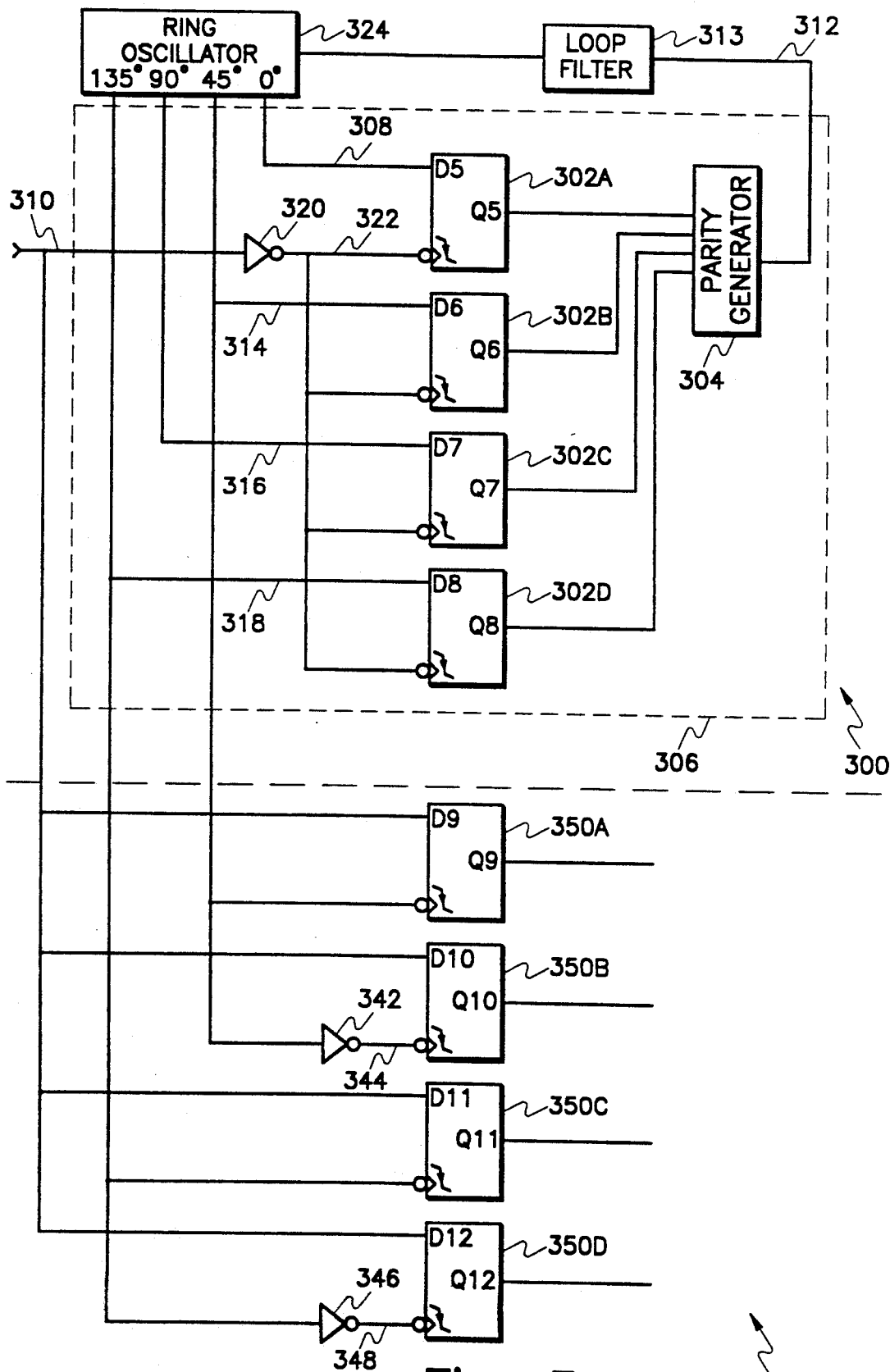
FIG. 3 is a schematic diagram of a preferred embodiment of the quarter-speed clock recovery circuit 300 and quarter-speed demultiplexer circuit 340 of the present invention.
Figure 4A:
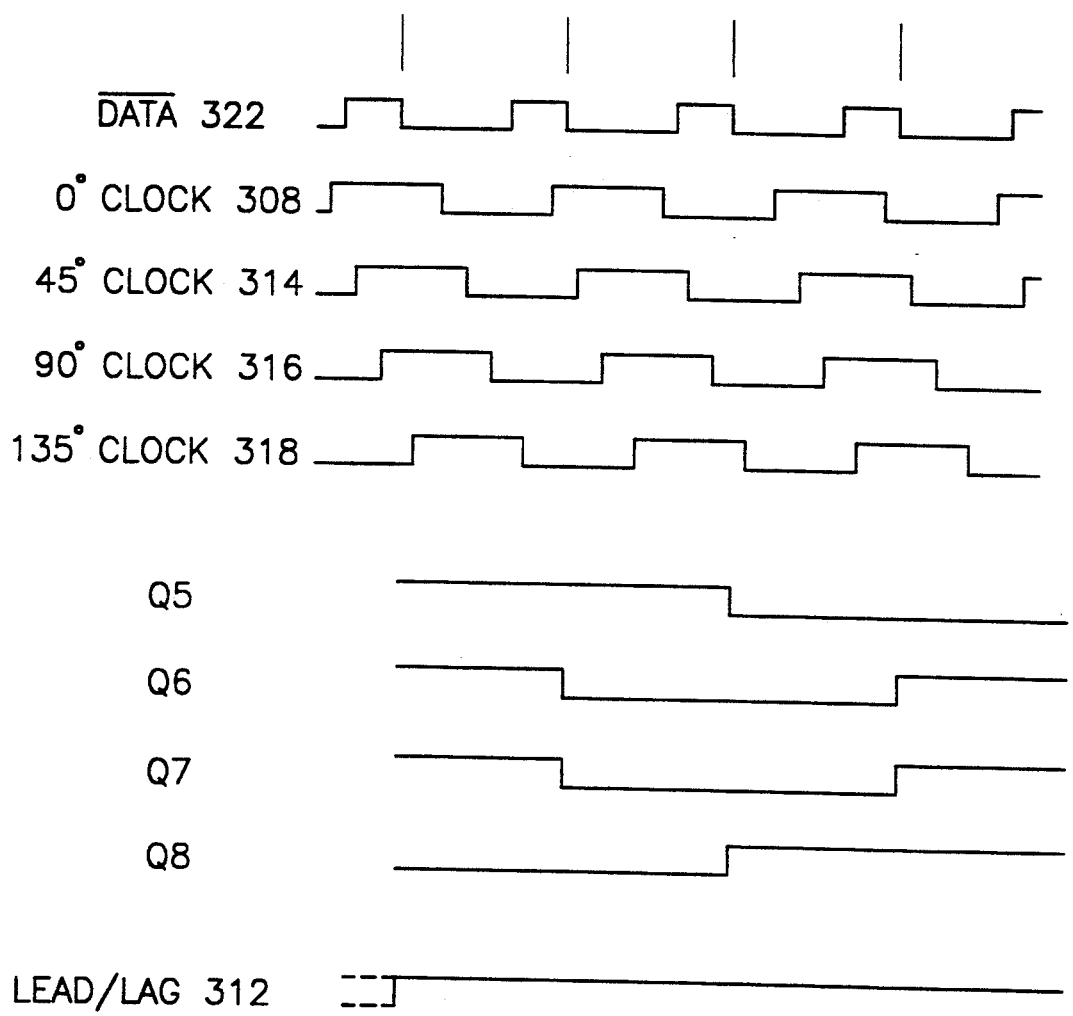
FIG. 4A is a timing diagram illustrating waveforms of a phase detector 306 of the present invention for the case of the clock leading the data.
Figure 4B:
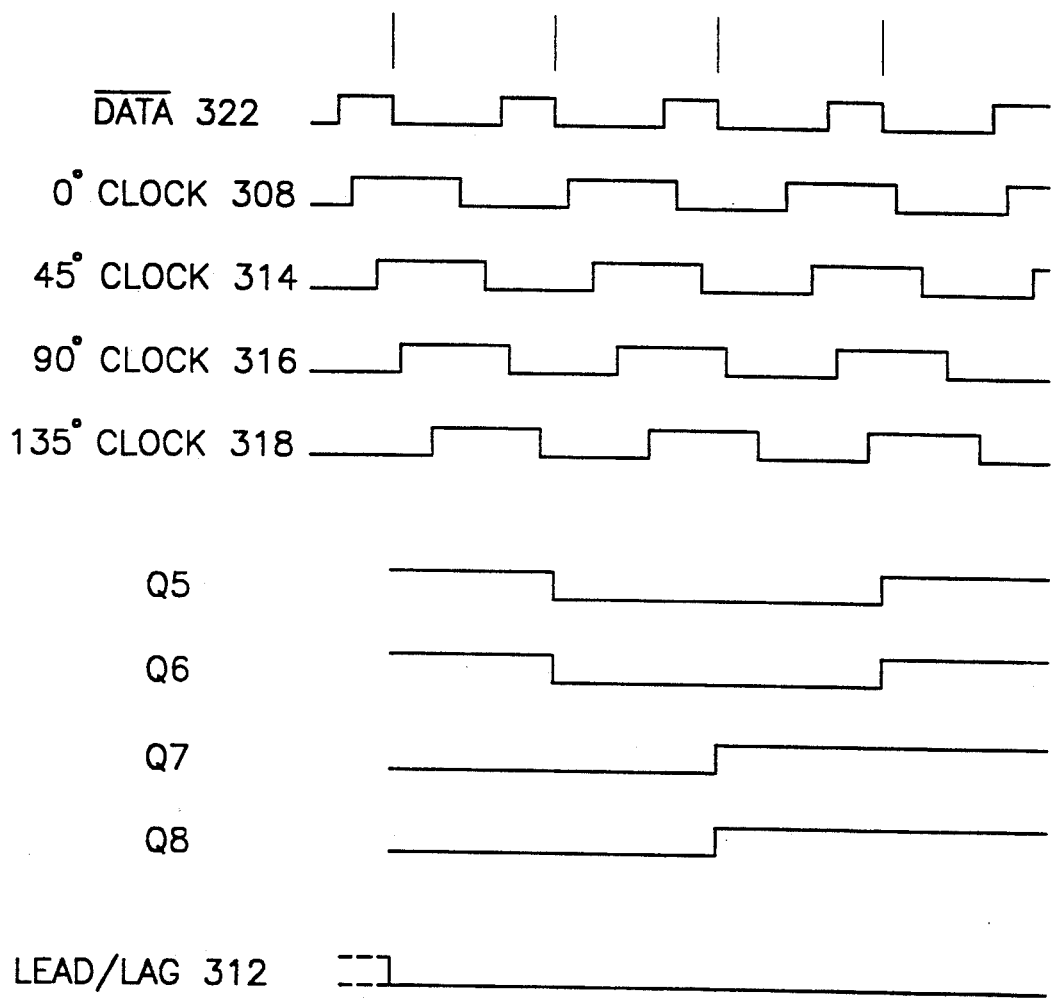
FIG. 4B is a timing diagram illustrating waveforms of a phase detector 306 of the present invention for the case of the clock lagging behind the data.

The present invention is not limited to operating at one half the data rate and performing a 1:2 demultiplexing function. The present invention can be extended to operate at even slower clock rates and perform wider demultiplexing functions. For example, a quarter-speed clock recovery circuit and a 1:4 demultiplexer circuit can be provided. FIG. 3 illustrates a block diagram of a quarter-speed clock recovery circuit 300 and a quarter-speed 1:4 demultiplexer 340. FIGS. 4A and 4B illustrate a timing diagram of the quarter speed clock recovery circuit 300.

Referring to FIGS. 3 and 4, the operation of the quarter-speed clock recovery circuit 300 will now be described. The quarter-speed clock recovery circuit 300 of the second embodiment utilizes four flip-flops 302A, 302B, 302C, and 302D and a parity generator 304 as a phase comparator 306. Phase comparator 306 compares the phase angle between a generated clock signal (referred to as "clock 308") and a receive data signal 310 (referred to as "data 310"). Phase comparator 306 provides feedback in the form of a lead/lag signal 312 which indicates whether clock 308 leads data 310 or lags behind data 310.

A ring oscillator 324 is used to generate clock 308. Ring oscillator 324 also generates a 45 degree clock 314, a 90-degree clock 316, and a 135-degree clock 318. An inverter 320 inverts data 310 to form an inverted data signal 322 (referred to as "inverted data 322"). Inverted data 322 is used to trigger flip-flops 302A, 302B, 302C, and 302D. Falling transitions of inverted data 322 sample 0-degree clock 308 at input D5 of flip-flop 302A to output Q5 of flip-flop 302A. Similarly, 45-degree clock 314 at an input D6 of flip-flop 302B is sampled to an output Q6 of flip-flop 302B; 90-degree clock 316 is sampled from an input D7 of flip-flop 302C, to an output Q7 of flip-flop 302C; and 135-degree clock 318 is sampled at an input D8 of flip-flop 302-D to an output Q8 of flip-flop 302D.

Outputs Q5, Q6, Q7 and Q8 are input to parity generator 304. The output of parity generator 304, lead/lag signal 312, is a logic-high state if an odd number of outputs Q5, Q6, Q7 and Q8 are at a logic-high state. Lead/lag signal 112 is a logic-low state for all other conditions. FIGS. 4A and 4B are timing diagrams which illustrate the operation of phase comparator 306. The case of the clock 308 leading data 310 is shown in FIG. 4A. In this case, there is always an odd number of flip-flop outputs Q5, Q6, Q7 and Q8 at a logic-high state. Therefore, the output of parity generator 304 is at a logic-high state.

FIG. 4B illustrates the case of clock 308 lagging behind data 310. Here there is never an odd number of flip-flop outputs Q5, Q6, Q7 and Q8 at a logic-high state. Therefore, the output of parity generator 304 is at logic-low state. Lead/lag signal 312 will always be at a logic-high state for the case of clock 308 leading data 310, and at a logic-low state for the case of clock 308 lagging behind data 310. Lead/lag signal 312 is fed back to ring oscillator 324 via low pass filter 313 to adjust the rate of clock 308 to be in phase with receive data 310 and at a rate one quarter the rate of data 310.

Referring again to FIG. 3, the operation of the quarter speed demultiplexer will now be described. 45-degree clock 314 is inverted in an inverter 342 to create inverted 45-degree clock 344. 135-degree clock 318 is inverted in an inverter 346 to create inverted 135-degree clock 348. Data 310 is clocked through flip-flops 350A, 350B, 350C and 350D using the standard and inverted 45 and 135-degree clocks.

The first bit in the serial stream of data 310 is clocked through flip-flop 350A by 45-degree clock 314. The third bit of the serial stream of data 310 is clocked through flip-flop 350B by inverted 45-degree clock 344. Similarly, the second bit of data 310 in the received serial data stream, is clocked through flip-flop 350C using 135-degree clock 318, and the fourth bit of data 310 is clocked through flip-flop 350D using inverted 135-degree clock 348. This process repeats with the fifth bit of data 310 being clocked through flip-flop 350A using 45-degree clock 314, and continues in this manner.

The output of flip-flop 350A is a data stream at one-quarter the original data rate representing every fourth bit of data 310 in the received stream. The output of flip-flop 350B represents every fourth bit of data 310 beginning with the third bit of data 310. Similarly, the outputs of flip-flops 350C and 350D represent every fourth bit of data 310 beginning with the second and fourth bits of data 310, respectively. The outputs of flip-flops 350A, 350B, 350C and 350D each represent one quarter of the received data 310 and each have a data rate at one quarter the original data rate of received data 310.

In addition, it is possible to modify the quarter-speed phase comparator of the present invention to trigger off of both the rising and falling edges of the data. This is accomplished by duplicating the phase comparator circuits of FIG. 3 with the exception of inverter 320. The second set of latches would trigger on the falling edge of received data 310, and the output of the second parity generator would also indicate the phase lead or lag condition. Triggering on both the rising and falling edges the data minimizes the time between corrections to the phase of clock 308, and leads to better noise performance depending on the link parameters and data sequences.

The half-speed and quarter-speed clock recovery and demultiplexer circuits described above operate without ever using a full-rate clock. This provides significant advantages over conventional systems requiring full-rate clocks. Overall performance can be improved because it is easier to maintain timing resolution with lower frequency signals. At high frequencies, the signal does not always settle to a solid high or low level causing the delay to vary. This problem is not as severe at lower frequencies. With a lower rate clock, it is easier to precisely place transitions of the clock so that they coincide with a stable portion of the data bits. Also, typical gate delays for lightly loaded circuits are significantly less than the rise and fall times of the circuits. It is therefore easier to position a logic-state transition precisely at lower clocking rates.

In many applications, low power consumption is required. In these applications the CMOS family of logic gates is typically used. Because the half-speed clock recovery and demultiplexer circuit of the present invention operates at half the clock rate and because CMOS logic requires less power when there is less switching, the power consumption of the half-rate clock recovery of the multiplexer circuit is much less than conventional clock recovery and demultiplexer circuits.

The half-speed and quarter-speed clock recovery and demultiplexer circuits of the present invention can be implemented using many different logic families and can be utilized with many different types of communication links. In the preferred embodiment of the present invention, the logic family chosen is Gallium Arsenide (GaAs) MESFET differential current switched logic and the link is a fiber optic communication link using run-length limited code data as specified by American National Standard Institute (ANSI) standard X3T9.3.

If differential logic is used to implement the clock recovery and demultiplexer circuit of the present invention, the complementary inputs may be used and the inverters are not necessary. This results in an added advantage of having complementary signals which are the true complement of the original signal with no time delay introduced by the inverters.

In summary, an apparatus and method have been described which allow the clock recovery, data re-time, and front-end demultiplexing functions of a fiber optic data link to be combined in such a way that the maximum operating frequency of these functions is one half the data rate of the received data signal. The clock recovery and demultiplexer circuit of the present invention consists of:

1) two half-speed clock signals offset by 90-degrees with respect to each other;
2) a digital phase comparator consisting of two edge triggered flip-flops which sample the in-phase and quadrature-phase clocks, at the time of transitions in the data, and an exclusive-OR gate which provides a phase comparison signal; the quadrature-phase clock is delayed with respect to the in-phase clock by one quarter period;
3) a differential ring oscillator to provide the two clock signals;
4) two re-timing latches, one triggered on the rising edge of the quadrature-phase clock and the other triggered on the falling edge of the quadrature-phase clock, thus providing a 1:2 demultiplexer function;
5) an extension of these concepts to even wider demultiplexing, and clock recovery at an even lower rate;
6) an extension of these concepts to allow use of both the rising and falling edges of the receive data signal to minimize time between corrections and optimize PLL performance.

While various embodiments of the present invention have been described above, it should be understood that they have been provided by way of example only, and not limitations. It will be understood by those skilled in the art that various changes in the form and details may be made without departing from the spirit and scope of the invention. Thus, the breadth and scope of the present invention should not be limited by any of the above-described embodiments, but should be defined only in accordance with the following claims and their equivalents.

Having thus described our invention, what we claim as new and desire to secure by Letters Patent is:

1. A clock recovery and demultiplexer circuit for recovering a clock signal from a received data signal and for demultiplexing the received data signal, and operating at a fraction of the data rate of the received data signal, said circuit comprising:
   a. clock signal generating means for generating a reference clock signal having a plurality of phases, said generated reference clock signal having a rate less than the data rate of the received data signal;
   b. comparing means for comparing the phase angle between said generated reference clock signal and the received data signal;
   c. frequency adjusting means responsive to said phase angle comparing means for adjusting said rate of said generated reference clock signal to synchronize said generated clock signal and the received data signal; and
   d. demultiplexing means for demultiplexing the received data signal into parallel signals at data rates lower than the data rate of the received data signal using at least one of each of the phase of said generated reference clock signal and inverted phases of said generated reference clock signal.

2. The clock recovery and demultiplexer circuit of claim 1, wherein:
   a. said clock signal generating means comprises means for generating 0-degree and 90-degree reference clock signals at one half the data rate of the received data signal;
   b. said comparing means comprises a phase comparator circuit for comparing the phase angle between said generated reference clock signal and the received data signal; and
   c. said demultiplexing means comprises means for demultiplexing the received data signal into two separate data streams, both at half the clock rate of the received data signal.

3. The clock recovery and demultiplexer circuit of claim 2, wherein:
   said means for generating a 0-degree and 90-degree reference clock signal is a ring oscillator;
   said half-speed phase comparator circuit comprises two edge-triggered flip-flops and an exclusive OR-gate; and
   said demultiplexing means comprises two edge-triggered flip-flops.

4. The clock recovery and demultiplexer circuit of claim 3, further comprising an inverter for inverting the received data signal, and an inverter for inverting said 90-degree clock signal.

5. The clock recovery and demultiplexer circuit of claim 1, wherein:
   a. said clock signal generating means comprises means for generating 0-degree, 45-degree, 90-degree and 135-degree reference clock signals at one quarter the data rate of the received data signal;
   b. said comparing means comprises phase comparator circuit for comparing the phase angle between the generated reference clock signal and the received data signal; and c. said demultiplexing means comprises means for demultiplexing the received data signal into four separate data signals, each at one quarter the clock rate of the received data signal.

6. The clock recovery and demultiplexer circuit of claim 5, wherein:

said means for generating a reference clock signal is a ring oscillator;

said quarter speed phase comparator circuit comprises four edge-triggered flip-flops and a parity generator; and said demultiplexing means comprises four flip-flops.

7. The quarter speed clock recovery and demultiplexer circuit of claim 6 further comprising an inverter for inverting the received data signal, and inverters for inverting the 45-and 135-degree clock signals.

8. A method of recovering a clock signal from a received data signal and for demultiplexing the received data signal, comprising the steps of:

a. generating a plurality of phases of a reference clock signal at a rate less than the data rate of the received data signal;

b. comparing the phase angle between said generated reference clock signal and the received data stream;

c. adjusting the frequency of said generated reference clock signal as a function of said comparing step to thereby synchronize said generated reference clock signal and the received data signal; and d. demultiplexing the received data signal into parallel signals at data rates lower than the data rate of the received data signal, using at lease one each of the phases of the generated reference clock signal and inverted phases of the generated reference clock signal.

9. The method of claim 8 further comprising the steps of: generating a 0-degree and a 90-degree reference clock signal at one half the data rate of the received data signal; and demultiplexing the received data signal into two separate data signals both at one half the clock rate of the received data signal.

10. The method of claim 8 further comprising the steps of:

generating a 0-degree, 45-degree and 90-degree an 135-degree clock signal; and demultiplexing the received data signal into four separate signals each at one quarter the clock rate of the received data signal.

11. A clock recovery and demultiplexer circuit for recovering clock signal from a received data signal and for demultiplexing the received data stream, and operating at a fraction of the data rate of the received data signal, said circuit comprising:

a. an oscillator for generating a reference clock signal having a plurality of phases, said generated reference clock signal having a rate less than the data rate of the received data signal;

b. a phase comparator for comparing the phase angle between said generated reference clock signal and the received data signal;

c. a feedback loop for adjusting said rate of said generated reference clock signal to synchronize said generated clock signal and the received data stream in response to a lead-lag signal generated by said phase comparator; and a demultiplexer for demultiplexing the received data stream into parallel signals at data rates lower than the data rate of the received data stream using at least one of each of the phase of said generated reference clock signal and inverted phases of said generated reference clock signal.

* * * * *